United States Patent
Raring et al.

(10) Patent No.: US 8,143,148 B1
(45) Date of Patent: Mar. 27, 2012

(54) SELF-ALIGNED MULTI-DIELECTRIC-LAYER LIFT OFF PROCESS FOR LASER DIODE STRIPES

(75) Inventors: James W. Raring, Goleta, CA (US);
Daniel F. Feezell, Goleta, CA (US);
Nick Pfister, Goleta, CA (US)

(73) Assignee: Soraa, Inc., Goleta, CA (US)

( * ) Notice: Subject to any disclaimer, the term of this patent is extended or adjusted under 35 U.S.C. 154(b) by 0 days.

(21) Appl. No.: 12/502,382

(22) Filed: Jul. 14, 2009

Related U.S. Application Data

(60) Provisional application No. 61/080,654, filed on Jul. 14, 2008.

(51) Int. Cl.
*H01L 21/30* (2006.01)
*H01L 33/00* (2006.01)

(52) U.S. Cl. ........ 438/487; 438/951; 438/981; 257/615; 257/646; 257/E21.587

(58) Field of Classification Search ............. 438/20–28, 438/37, 38, 41–47, 84–87, 93–95, 102–105, 438/211, 216, 221, 225, 240, 257, 261, 263, 438/264, 287, 294–307, 342–346, 478–509, 438/607, 647, 679–681, 765–794, 942–951, 438/967, 981; 257/125, 164, 181, 198, 310–311, 257/374, 389, 410, 411, 458, 506–508, 510, 257/514, 520, 524, 613–616, 626, 632–651, 257/656, 671, 687, 688, 700–703, 709, 710, 257/717, 745–760, E21.023, E21.025, E21.034, 257/E21.038, E21.039, E21.221, E21.223, 257/E21.309, E21.587, E29.114, E29.115, 257/E29.124, E29.199, E33.046, E29.336; 257/E31.036, E31.087, E31.088, E31.061, 257/E31.062, E31.065, E31.066, E29.338, 257/E27.04, E27.068, E29.041
See application file for complete search history.

(56) References Cited

U.S. PATENT DOCUMENTS

| | | | |
|---|---|---|---|
| 2006/0256482 A1* | 11/2006 | Araki et al. | 360/319 |
| 2008/0121916 A1* | 5/2008 | Teng et al. | 257/98 |
| 2009/0081857 A1* | 3/2009 | Hanser et al. | 438/507 |

OTHER PUBLICATIONS

Sizov et al., "500-nm Optical Gain Anisotropy of Semipolar (1122) InGaN Quantum Wells," 2009, Applied Physics Express, vol. 2, pp. 071001-1-071001-3.

* cited by examiner

*Primary Examiner* — Matthew Smith
*Assistant Examiner* — Walter H Swanson
(74) *Attorney, Agent, or Firm* — Kilpatrick Townsend & Stockton LLP

(57) ABSTRACT

A method for forming a laser diode structure. The method includes providing a laser diode material having a surface region. A multilayer dielectric mask structure comprising alternating first and second dielectric layers is formed overlying the surface region. The method forms a laser diode structure using the multilayer dielectric mask structure as a mask. The method selectively removes a portion of the first dielectric layer to form one or more undercut regions between the second dielectric layers. A passivation layer overlies the multilayer dielectric mask structure and the undercut region remained intact. The dielectric mask structure is selectively removed, exposing a top surface region of the laser diode structure. A contact structure is formed overlying at least the exposed top surface region.

15 Claims, 13 Drawing Sheets

SELF-ALIGNED MULTI-DIELECTRIC-LAYER LIFT OFF PROCESS FOR LASER DIODE STRIPES

CROSS-REFERENCES TO RELATED APPLICATIONS

This application claims priority to U.S. Provisional Application No. 61/080,654 filed Jul. 14, 2008, commonly assigned, and hereby incorporated by reference in its entirety herein.

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention is directed to optical devices and related methods. More particularly, the present invention provides a method and device for emitting electromagnetic radiation for optical devices using non-polar or semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the lightbulb. The conventional lightbulb, commonly called the "Edison bulb," has been used for over one hundred years. The conventional light bulb uses a tungsten filament enclosed in a glass bulb sealed in a base, which is screwed into a socket. The socket is coupled to an AC power source or a DC power source. The conventional light bulb can be found commonly in houses, buildings, and outdoor lighting applications, and other areas requiring light. Unfortunately, drawbacks exist with the conventional Edison light bulb. That is, the conventional light bulb dissipates much thermal energy leading to inefficiencies. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas. A pair of electrodes is coupled between the halogen gas and couples to an alternating power source through a ballast. Once the gas has been excited, it discharges to emit light. Often times, the optically clear tube is coated with phosphor materials. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide (or AlInGaP) semiconductor materials. Most recently, Shuji Nakamura pioneered the use of InGaN materials to produce LEDs emitting light in the blue color range for blue LEDs. The blue colored LEDs lead to innovations such as the Blu-eRay™ DVD player, solid state white lighting, and other developments. Other colored LEDs have also been proposed.

High intensity green LEDs based on GaN have been proposed and even demonstrated with limited success. Unfortunately, achieving high intensity, high-efficiency GaN-based green LEDs has been problematic. The performance of optoelectronic devices fabricated on conventional c-plane GaN suffer from strong internal polarization fields, which leads to poor radiative recombination efficiency. Since this phenomenon becomes more pronounced in InGaN layers with increased indium content for increased wavelength emission, extending the performance of GaN-based LEDs to the green regime has been difficult. Furthermore, increased indium content in a GaN film often requires reduced growth temperature leading to poorer crystal quality of high-indium-content InGaN films. The difficulty of achieving a high intensity green LED has lead scientists and engineers to the term "green gap" to describe the generally unavailability of such green LED.

SUMMARY OF THE INVENTION

The present invention is directed to optical devices and related methods. More particularly, the present invention provides a method and device for emitting electromagnetic radiation for optical devices using non-polar or semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices In a specific embodiment, a method for forming a laser diode structure is provided. The method includes providing a laser diode material structure having a surface region. The laser diode material structure includes an underclad layer, an upper clad layer and an active layer sandwiched between the under clad layer and the upper clad layer. A multilayer dielectric stack is deposited overlying the surface region. In a specific embodiment, the multilayer dielectric stack includes alternating layers of at least a first dielectric layer and a second dielectric layer. The method selectively removes a portion of the multilayer dielectric stack to form a dielectric mask structure using a pattern and etch process. A portion of the upper clad layer is removed using the dielectric mask structure as a mask to form a laser diode structure. In a specific embodiment, the laser diode structure has an exposed sidewall region and a top region. In a specific embodiment, a portion of each of the first dielectric layer is selectively removed to form an undercut region between the second dielectric layers. A passivation layer is formed conformingly overlying at least the exposed sidewall region, and the dielectric mask structure while maintaining the undercut region unfilled. The dielectric mask structure is removed to expose the top surface region of the laser diode structure using a selective etch process. In a specific embodiment, the undercut region allows the selective etch process to occur in a lateral direction. The method forms a contact structure overlying at least the top surface region.

In an alternative embodiment, a method of processing an optical device is provided. The method includes providing a gallium and nitrogen containing substrate material having a surface region. The method forms a multi-layered stack region overlying the surface region. The multi-layered stack region includes at least a first dielectric layer and an overlying second dielectric layer in a specific embodiment. The first dielectric layer overlies the surface region in a specific embodiment. The multi-layered stack region is patterned to form a patterned mask structure and a ridge region is formed using the patterned mask structure as mask. The method includes selectively removing one or more portions of the patterned mask structure in a specific embodiment.

Many benefits can be achieved by the present invention. For example, the multilayer mask structure eliminates the use of a photoresist material to expose a top surface region. The top surface region allows for a contact structure to form for the optical device structure according to one or more embodiments. In addition, the multilayer mask structure also provides for a thick dielectric mask without incurring stress on the optical device structure according to one or more embodiments.

DETAILED DESCRIPTION OF THE INVENTION

Figure 1:
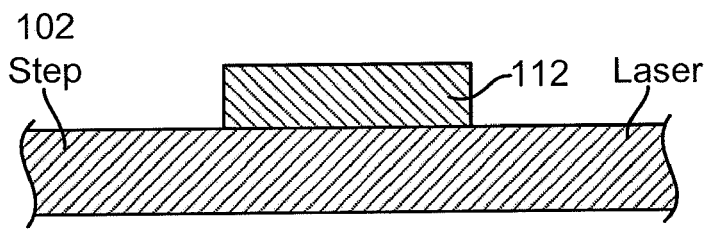
FIG. 1 is simplified diagram illustrating a conventional method of forming a laser diode stripe.
Figure 1:
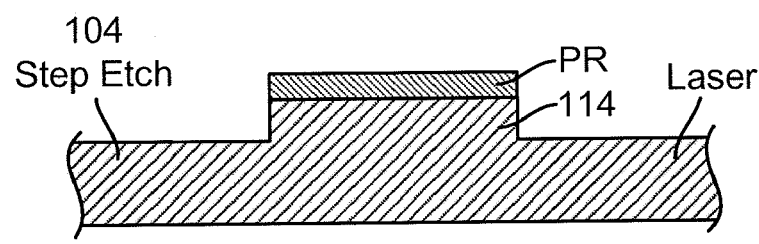
Figure 1:
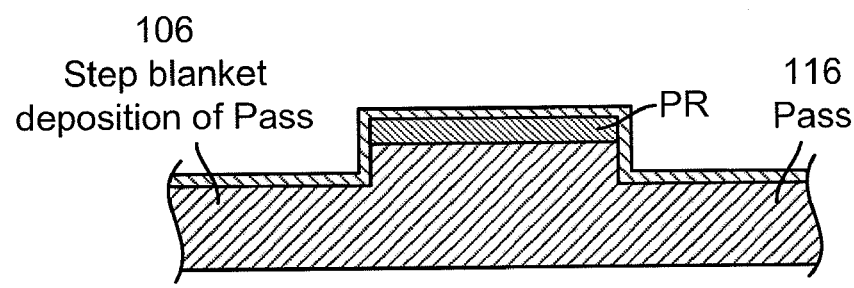
Figure 1:
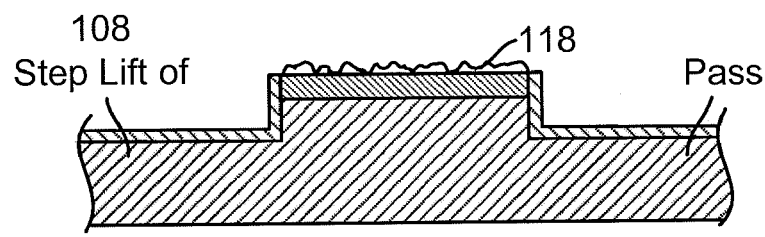

The present invention is directed to optical devices and related methods. More particularly, the present invention provides a method and device for emitting electromagnetic radiation for optical devices using non-polar or semipolar gallium containing substrates such as GaN, AlN, InN, InGaN, AlGaN, and AlInGaN, and others. Merely by way of example, the invention can be applied to optical devices, lasers, light emitting diodes (e.g., red, green, blue), solar cells, photoelectrochemical water splitting and hydrogen generation, photodetectors, integrated circuits, and transistors, among other devices.

As used herein, the term gallium nitride substrate material is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other meanings understood by one of ordinary skill in the art.

This specification describes improved methods to fabricate laser stripes using a dielectric lift process according to one or more embodiments. A desired result of this process is to efficiently remove a blanket coated passivation layer such as ZrO2, Ta2O5 or amorphous silicon from the laser diode ridge tops to expose a clean surface for metal contact. There are several benefits to our proposed technique relative to conventional self-aligned lift-off methods that rely on a single dielectric layer or photoresist to remove the passivation layer. Self-aligned photoresist-based processes begin with the patterning of the photoresist into the desired laser stripe geometry, followed by the etching of the laser stripe pattern into the semiconductor below using the resist as the etch mask. This is followed by a blanket deposition of one or more passivation layers and a lift-off step such that the resist lifts off the passivation layer(s) from the ridge top exposing the semiconductor only in this region. The benefit to this process is that undercut resist profiles can be easily achieved such that lift-off of the passivation layer(s) is trivial and does not require mechanical assistance such as an ultrasonic bath.

A drawback to this method is that the photoresist mask can lead to the formation of chemical resistant polymers during the semiconductor etch, which can create issues in subsequent processing steps and reduce device yield. To avoid this problem a thick (+1 µm) dielectric mask can be patterned using photoresist, after which the photoresist is removed such that only dielectric remains on the sample during the semiconductor etch step according to one or more embodiments. The dielectric material should be thick to withstand the semiconductor etch step and to facilitate lift-off of the passivation layer. After the semiconductor etch, the thick dielectric layer remains on the ridge tops during a blanket coating of the passivation layer. Next the sample is placed in an ultrasonic bath and submerged in an etch agent such as buffered hydrofluoric acid, commonly called "BHF." The ultrasonic action delaminates the thick dielectric mask layer from the ridge tops, lifting off the passivation layer on top of the dielectric mask layer, leaving exposed semiconductor material only on the tops of the ridges.

A drawback to this process is that it relies on mechanical removal of the dielectric mask layer, which is rather aggressive and can lead to microstructural issues in the semiconductor such as propagation of the micro-cracks. Furthermore, some of the thick dielectric layers used in this process often suffer from excessive strain leading to premature delamination such that the pattern fidelity is degraded during the patterning step or bare ridge tops are exposed during coating of the passivation layer.

In a specific embodiment, the present self-aligned process is shown in detail in the Figures that accompany the present specification. One or more of difference between the present process and the process that uses a thick dielectric layer is that our process uses a multi-layer dielectric stack according to one or more embodiments. By depositing alternating layers of two different dielectrics such as $Si_xN_y$ and $SiO_2$ (or other suitable materials) and then patterning the laser stripe geometry into this layer stack, we avoid using photoresist during the semiconductor etch step. Of course, there can be other combination of different materials depending upon the specific embodiment. After this etch is complete, the sample is subjected to an acid dip that will preferentially etch one dielectric relative to the other. In our example, $SiO_2$ will etch 2-10 times faster than $Si_xN_y$ in buffered HF. This will result in undercutting of the $Si_xN_y$ layer according to a specific embodiment.

When the passivation layer such as $ZrO_2$, $Ta_2O_5$, or amorphous silicon is deposited using a directional deposition method such as electron-beam deposition or sputtering, the passivation layer will be discontinuous on the sides of the dielectric stack as shown according to a specific embodiment. These discontinuities will allow a liquid etchant to penetrate into the dielectric layers and remove both the dielectric and passivation layers from the ridge tops. In this process no aggressive mechanical assistance will be needed for lift-off.

Furthermore, since alternating dielectric layers are used, strain compensation can realized if the two alternating dielectric layers have opposite strain polarities such as $SiO_2$ and $Si_xN_y$, among other materials. This will allow for thick stacks to be deposited without the delamination issues that result from a single thick layer. Thus, our process solves the problem of photoresist presence during the semiconductor etch step, eliminates the need for aggressive mechanical assistance, and allows for thick dielectric layers to withstand the etch. These and other details of the present invention are described throughout the present specification and more particularly below.

Important aspects of the process according to a specific embodiment are outlined below:
1. The dielectric layers have the same or similar dry etch properties such that vertical sidewalls can be achieved according to one or more embodiments.
2. The dielectric layers have different wet etch rates to achieve the undercutting effect such as, for example, $Si_xN_y$ and $SiO2$ etched in BHF according to one or more embodiments.
3. The dielectric layers preferentially etch relative to the passivation layer remains intact during the lift-off process according to one or more embodiments. For example, BHF will not attack high-quality $ZrO2$, $Ta2O5$, or amorphous silicon, but will etch $Si_xN_y$ and $SiO2$.

It is important to note that in the attachment showing an example of our proposed process, the dielectric layers are shown with approximately equal thickness and with one possibility for the order and number of layers according to a specific embodiment. There are several other dielectric stack configurations that could be advantageous. For example, a thicker uppermost layer may be desired to withstand the semiconductor etch step and undercut step, the number of undercut layers does not have to be two as in our example, and the bottom most layer does not necessarily have to be an undercut layer. Other embodiments of this invention include using a multilayer passivation layer scheme, such as a first layer contacting the semiconductor surface comprised of $SiO2$ and a second layer such $ZrO2$, $Ta2O5$, or amorphous silicon that will protect the first layer from the etchant solution during the lift-off process. There are many degrees of freedom in this process that offer flexibility.

FIG. 1 is a simplified diagram illustrating a conventional self-aligned lift-off method to form a laser diode stripe structure. The conventional method relies on a single dielectric layer or photoresist to remove the passivation layer. As shown, a self-aligned photoresist-based processes begin with the patterning of a photoresist 112 into the desired laser stripe geometry 114, followed by the etching (Step 104) of the laser stripe pattern into the semiconductor below using the resist as the etch mask. This is followed by a blanket deposition (Step 106) of a passivation layer 116 and a lift-off step (Step 108) such the resist lifts off the passivation layer from the ridge top exposing the semiconductor only in this region. A feature to this process is that undercut resist profiles can be easily achieved such that lift-off of the passivation layer is trivial and does not require mechanical assistance such as an ultrasonic bath. A drawback to this method is that the photoresist mask can lead to the formation of chemical resistant polymers 118 during the semiconductor etch. Such defects reduce device yield and affect device reliability.

A method for forming a laser diode stripe structure according to an embodiment of the present invention is described next.

(1) Start
(2) Providing a laser diode structure including an under clad layer, an upper clad layer and an active layer sandwiched between the under clad layer and the upper clad layer;
(3) Depositing a multilayer dielectric stack comprising alternating layers of a first dielectric layer and a second dielectric layer overlying the laser diode structure;
(4) Selectively removing a portion of the multilayer dielectric stack to form a multilayer dielectric stack structure using a pattern and etch process;
(5) Removing a portion of the upper clad layer while maintaining the multilayer dielectric stack structure, exposing a surface region and forming an upper clad layer ridge structure, the upper clad layer ridge structure including an exposed side wall region and a top region;
(6) Selectively removing a portion of each of the first dielectric layer to form one or more undercut region between the second dielectric layers;
(7) Depositing one or more passivation layers overlying the surface region of the upper layer, the exposed sidewall region, and the multilayer dielectric stack structure, while the undercut regions remained substantially intact (in one or more embodiments, the layers are conformingly overlying the surface region);
(8) Removing the multilayer dielectric stack structure using a selective etch process, whereupon the undercut regions allow the selective etch process to occur in a lateral direction;
(9) Exposing the top surface region; and
(10) Forming a contact structure overlying at least the top surface region.

The above sequence of steps provides a self-aligned method for forming a laser diode structure including a electrode structure according to an embodiment of the present invention. Depending on the specific embodiment, one or more steps may be included, one or more steps may be omitted, or one or more steps may be performed in a different sequence without departing from the scope of the present invention. One skilled in the art would recognize other variations, modifications, and alternatives.

Figure 2:
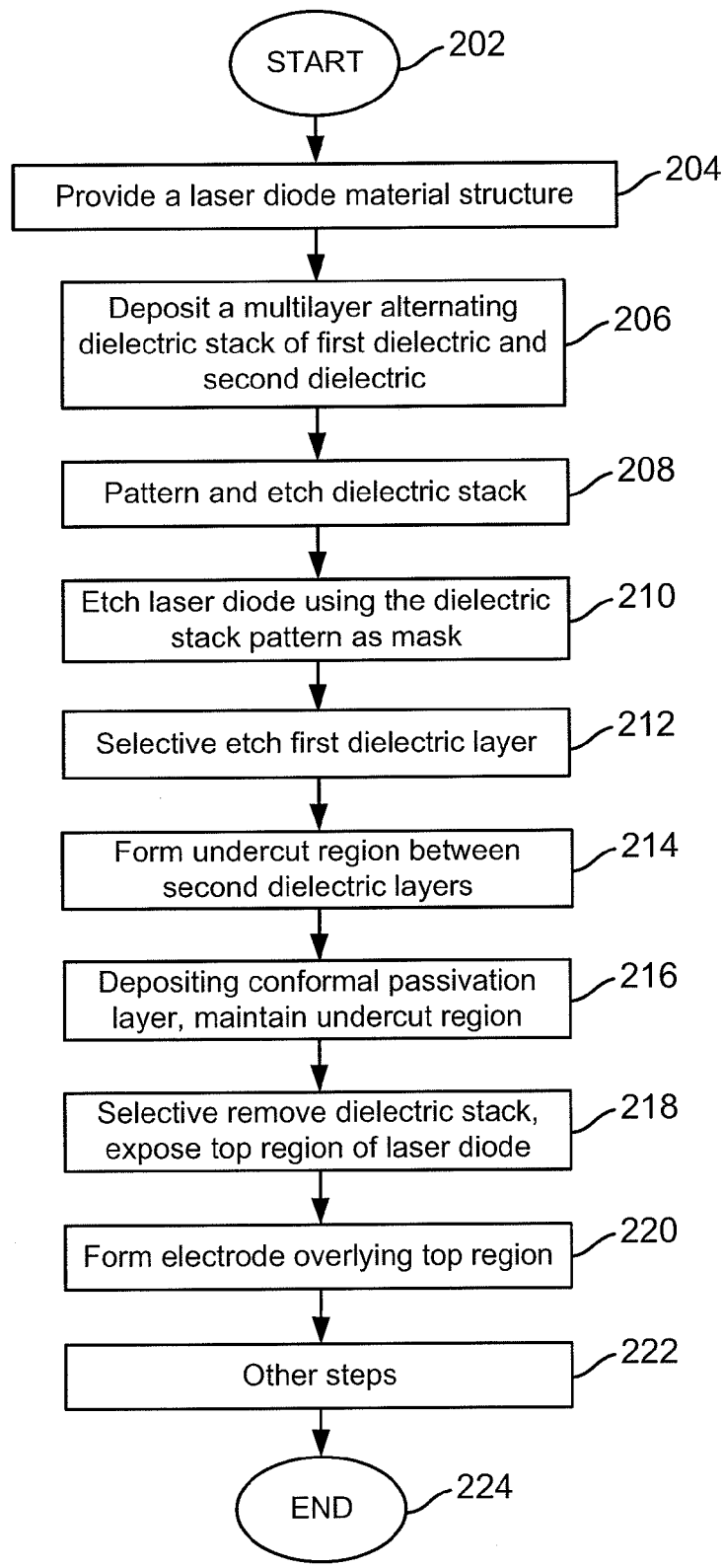
FIG. 2 is simplified process flow diagram illustrating a method of forming a laser diode stripe according to an embodiment of the present invention.

FIG. 2 is a simplified process flow diagram 200 illustrating a method of forming a laser diode stripe according to an embodiment of the present invention. As shown, the method begins with a Start step (Step 202). A laser diode material structure is provided (Step 204). In a specific embodiment, the laser diode material structures comprises one or more gallium nitride materials, but can be others. The method includes depositing a multilayer dielectric stack comprising at least one alternating first dielectric layer and second dielectric layer in a specific embodiment (Step 206). The dielectric stack is subjected to a patterned and etched process to provide for a dielectric mask structure (Step 208). Again, there can be other variations, modifications, and alternatives.

Referring again to FIG. 2: In a specific embodiment, the method includes forming a laser diode structure (Step 210) using the dielectric mask structure as a masking layer while maintaining the dielectric mask structure substantially intact in a specific embodiment. In a specific embodiment, the dielectric mask structure is configured to provide for a ridge structure for the laser diode structure. The laser diode structure can have other geometrical configurations depending on the application. In a specific embodiment, the dielectric mask structure is subjected to a selective etch process (Step 212) to remove a portion from each of the first dielectric layers to form an undercut region between adjacent second dielectric layers in a specific embodiment (Step 214). The method deposits a conformal passivation layer overlying at least the etched dielectric stack, exposed portion of the laser diode structure while maintaining the undercut regions substantially intact (Step 216). The conformal passivation layer can include ZrO2, Ta2O5, or amorphous silicon and the like in a specific embodiment. In a specific embodiment, the method includes selectively removing the dielectric stack, exposing a top region of the laser diode structure (Step 218) in a specific embodiment. The method forms an electrode overlying the top region of the laser diode structure (Step 220). The method ends with a stop step (Step 222). The above sequence of steps provides a self-aligned method for forming a laser diode structure including a electrode structure according to an embodiment of the present invention.

Figure 3:
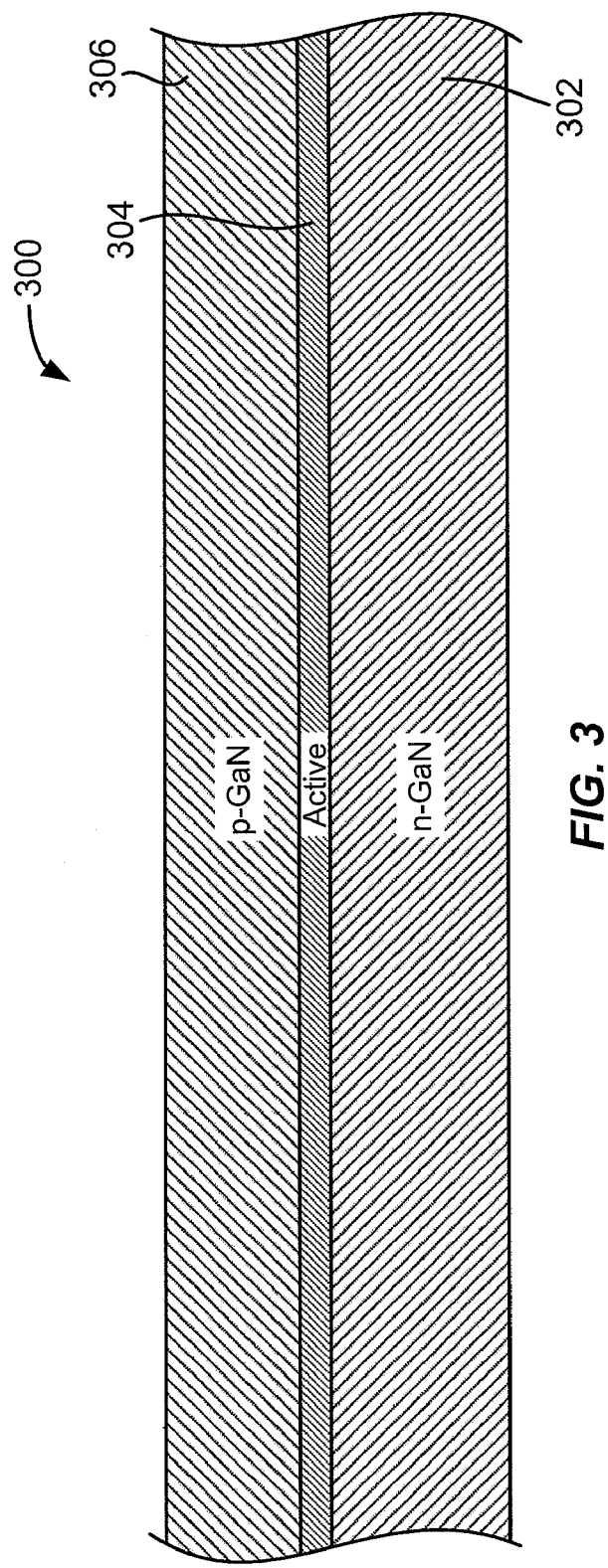
FIGS. 3-13 are simplified diagrams illustrating the method of forming a laser diode stripe according to an embodiment of the present invention.

FIGS. 3-13 are simplified diagrams illustrating a method of forming a laser diode structure according to an embodiment of the present invention. As shown in FIG. 3, a laser diode material structure 300 is provided. The laser diode material structure includes an underclad layer 302, an active layer 304 and an upper clad layer 306. The laser diode material may also have other configuration. In a specific embodiment, the underclad layer may be a gallium containing material such as gallium nitride or other suitable gallium containing material. In certain embodiment, the underclad layer can have an n-type characteristic. The active layer is usually a doped gallium nitride material, for example, InGaN, AlGaN but can also be others. In a specific embodiment, the active layer is epitaxially grown on a non-polar or semi-polar crystal plane of the underclad layer. The upper clad layer overlies the active layer, as shown. The upper clad layer can be a gallium nitride material in a specific embodiment. Depending on the application, the upper clad layer can having a p-type impurity characteristics.

Figure 4:
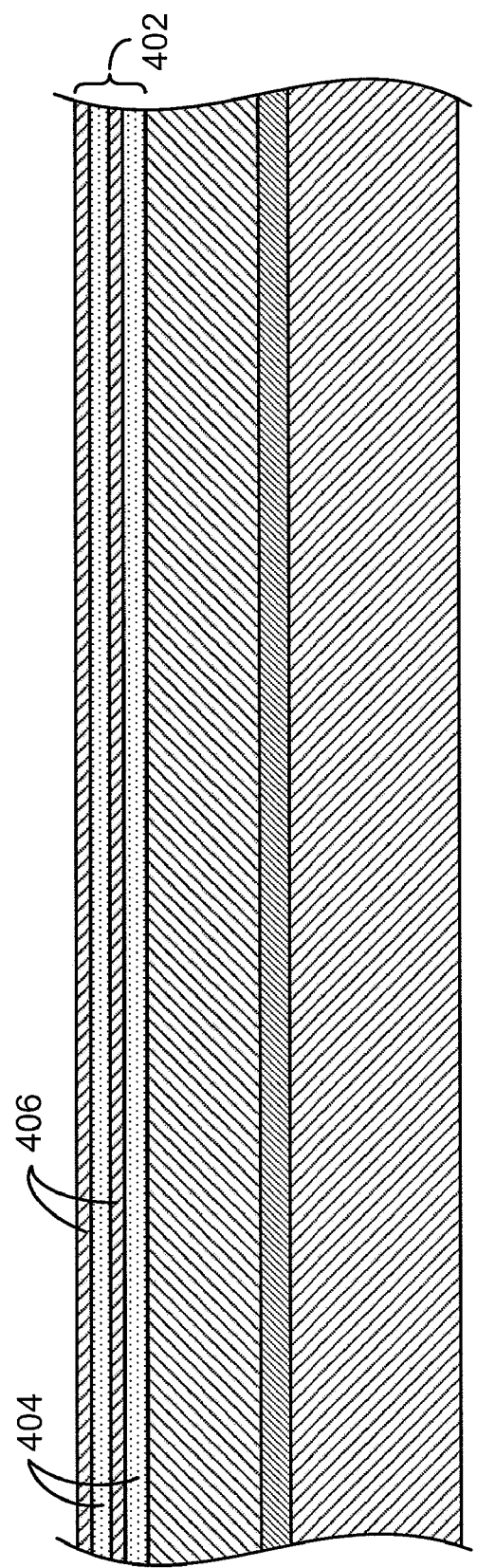
Figure 5:
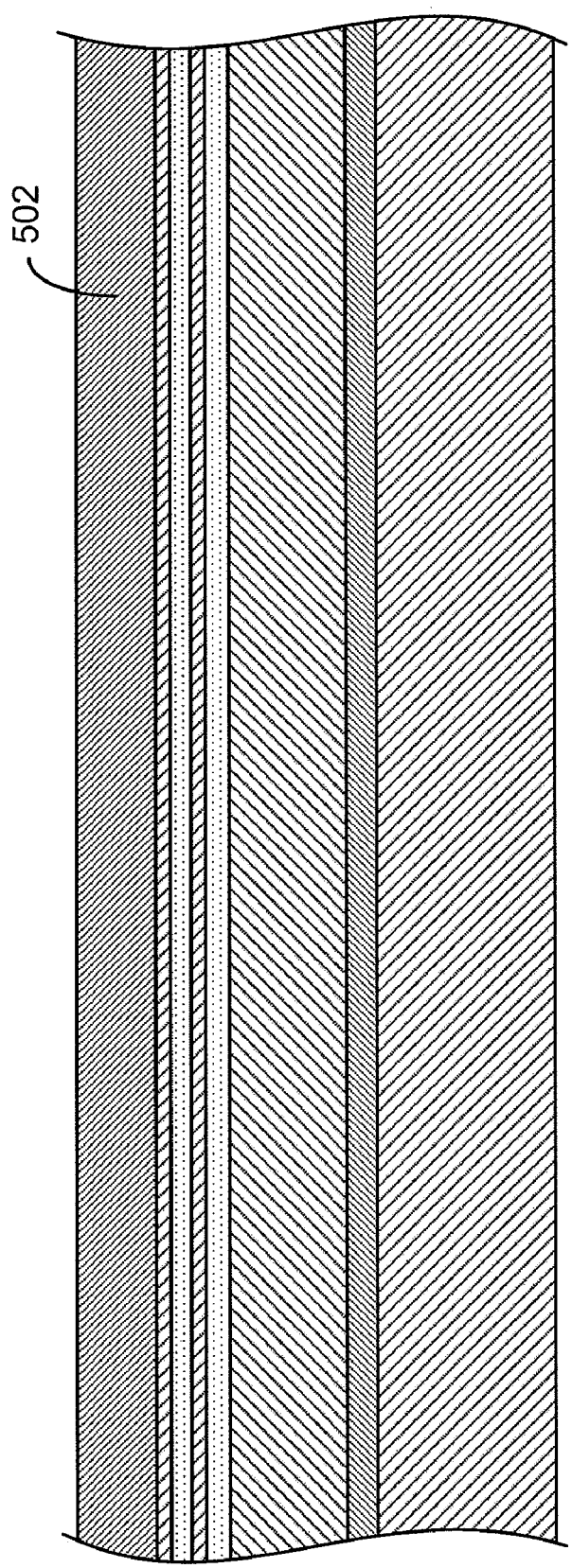

Referring to FIG. 4, the method includes depositing a dielectric stack 402 overlying the laser diode material structure. As shown, the dielectric stack includes alternating layers of a first dielectric material 404 and a second dielectric material 406. The first dielectric material and the second dielectric material are selected to have certain etch characteristics in a specific embodiment. In addition, the first dielectric layer and the second dielectric layer are selected to have an opposite strain polarities to prevent delamination from the laser diode material. In a specific embodiment, the first dielectric material is silicon oxide and the second dielectric material is silicon nitride. Other dielectric materials may also be used depending on the application. In a specific embodiment, the first dielectric layer has the same thickness as the second dielectric layer. In an alternative embodiment, the first dielectric layer may have a different thickness as the second dielectric layer. In a preferred embodiment, the top layer is thicker than the underlying dielectric layers. Such a configuration allows the dielectric stack to withstand a subsequent semiconductor material etch or other etch process.

Figure 6:
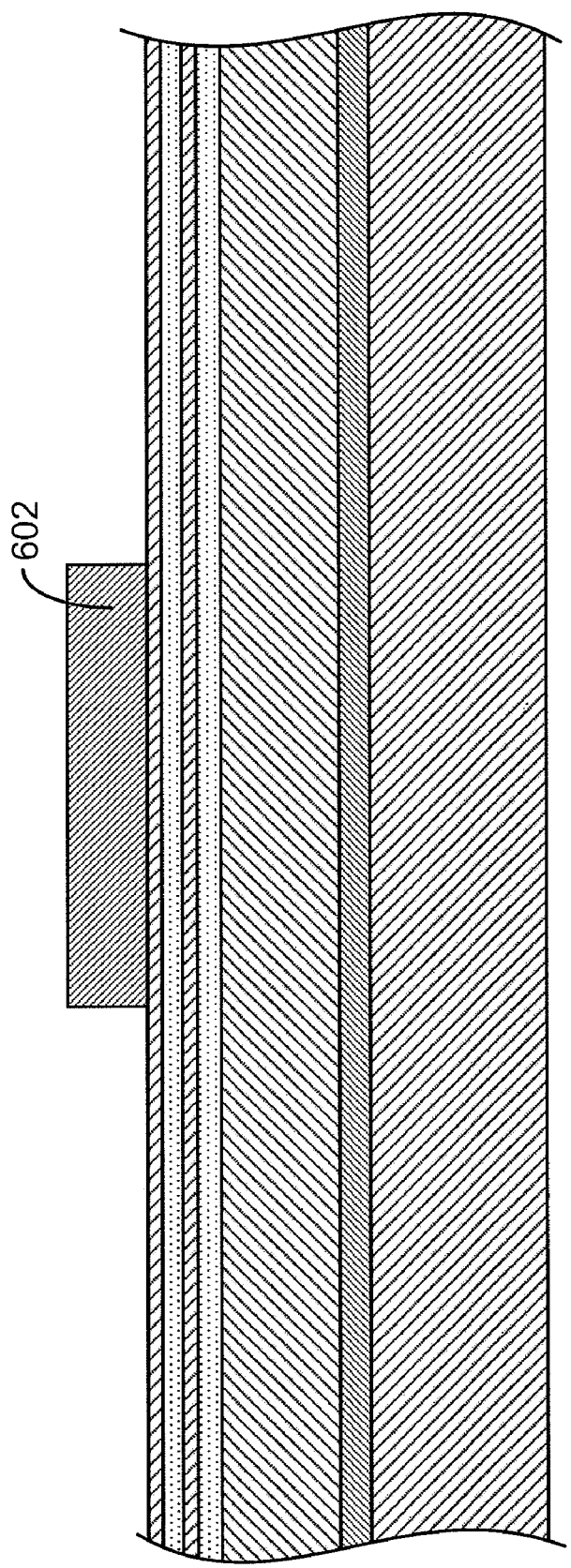
Figure 7:
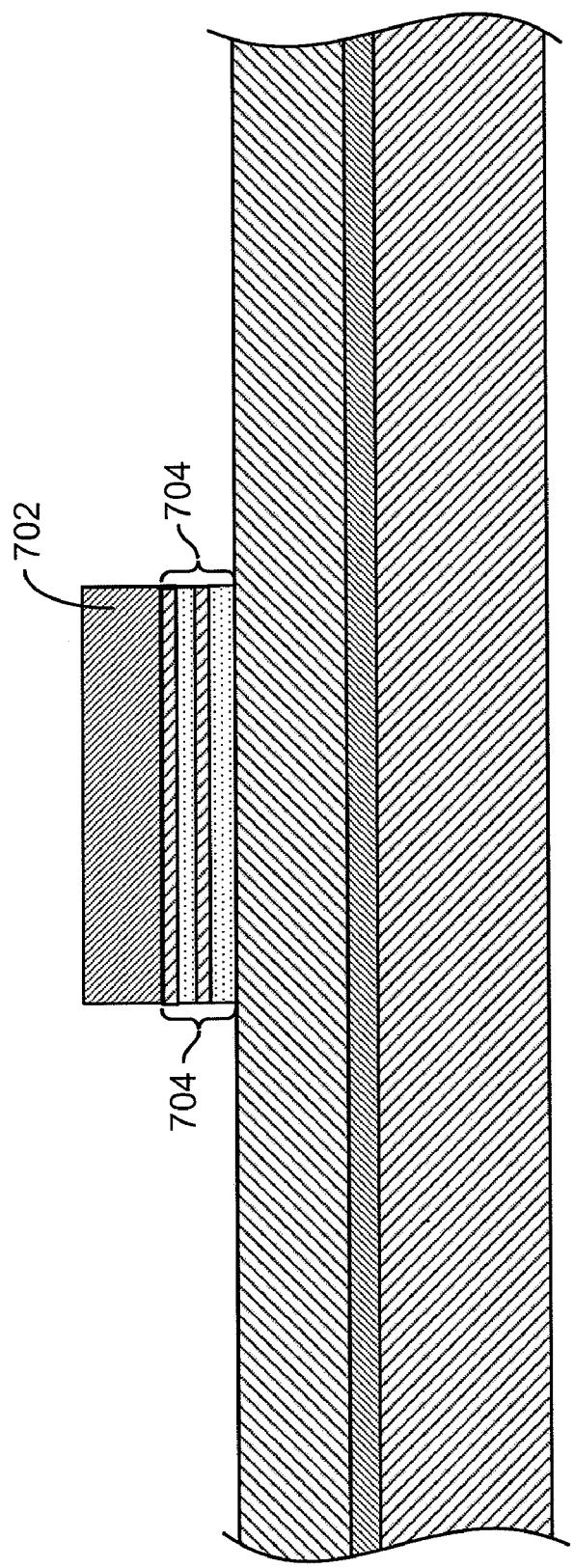
Figure 8:
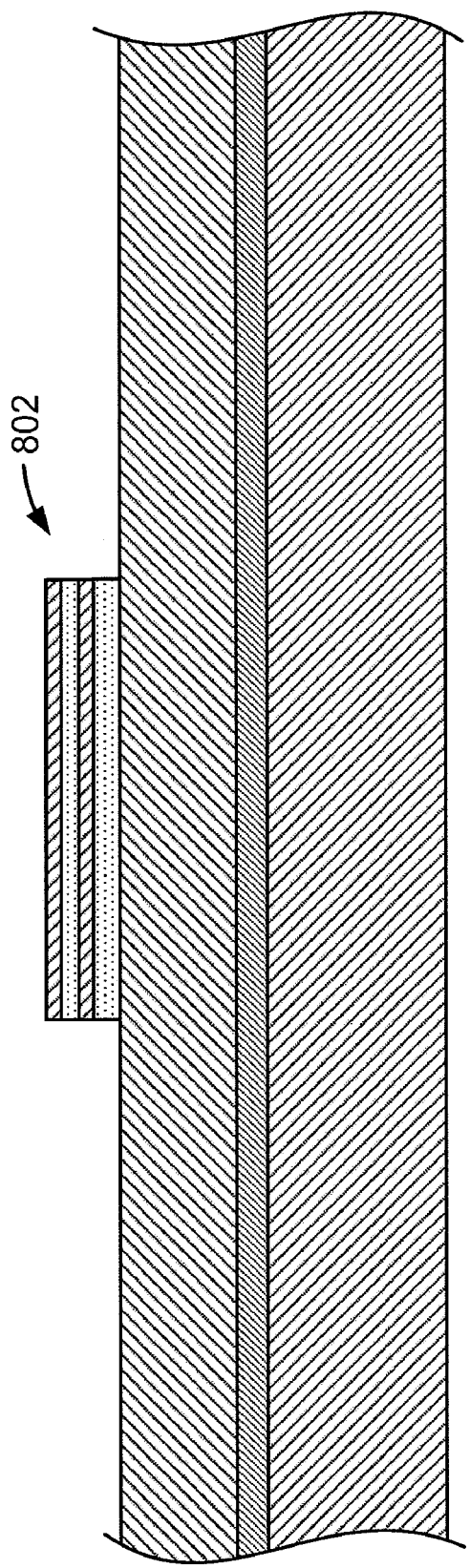

As shown in FIGS. 5-8, the dielectric stack is subjected to a pattern and etch process to form a dielectric mask structure. A photoresist 502 is deposited overlying the dielectric stack using for example, a spin on process. The photoresist layer is patterned to form a masking structure 602 as shown in FIG. 6. As shown in FIG. 7, the method includes a first etching process to form a dielectric mask structure 702. The first etching process can be a dry etch process using suitable fluorinated species in a plasma environment in a specific embodiment. In a specific embodiment, the first etching process has substantially the same etch selectivity for the first dielectric layer and the second dielectric layer to provide for a vertical side wall 704 for the dielectric mask structure. The photoresist masking structure is removed to form the dielectric mask structure 802 as shown in FIG. 8. As shown, the dielectric mask structure includes the alternating layers of silicon oxide and silicon nitride in a specific embodiment.

Figure 9:
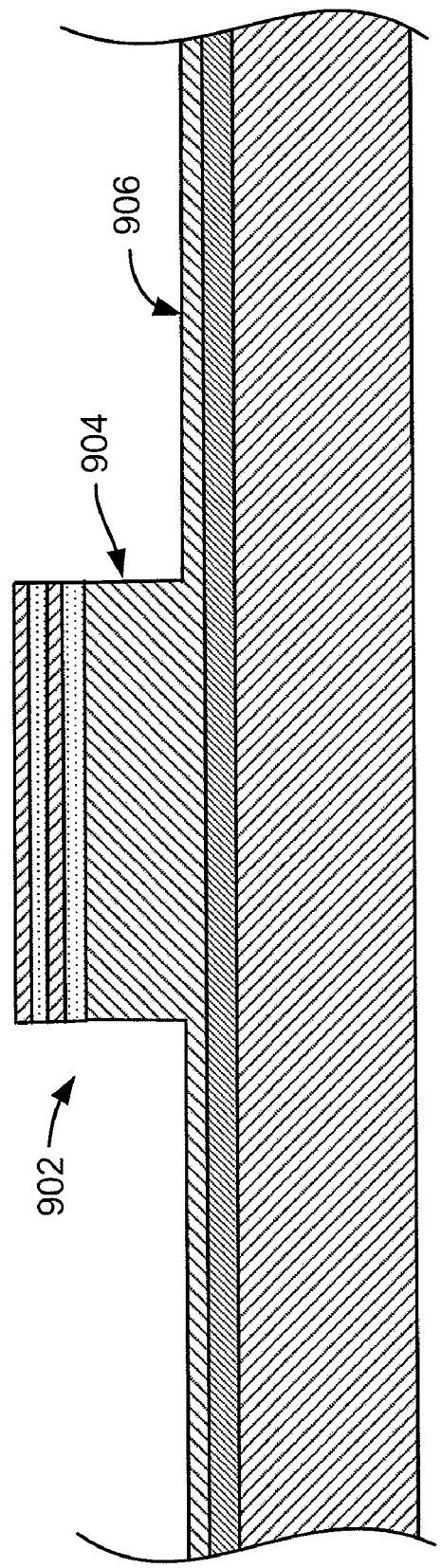

In a specific embodiment, the method performs a first selective etching process using the dielectric mask structure as an etch mask as shown in FIG. 9. The first selective etching process remove a portion of the upper clad layer to from a laser diode structure 902 while the dielectric mask structure remains substantially intact. Depending on the embodiment the laser diode structure may have different geometrical configurations such as stripes, islands, or other shape. The first selective etching process can be a plasma etch process or a wet etch process depending on the application. As shown, the laser diode structure has an exposed side region 904 and a first exposed region 906 in a specific embodiment.

Figure 10:
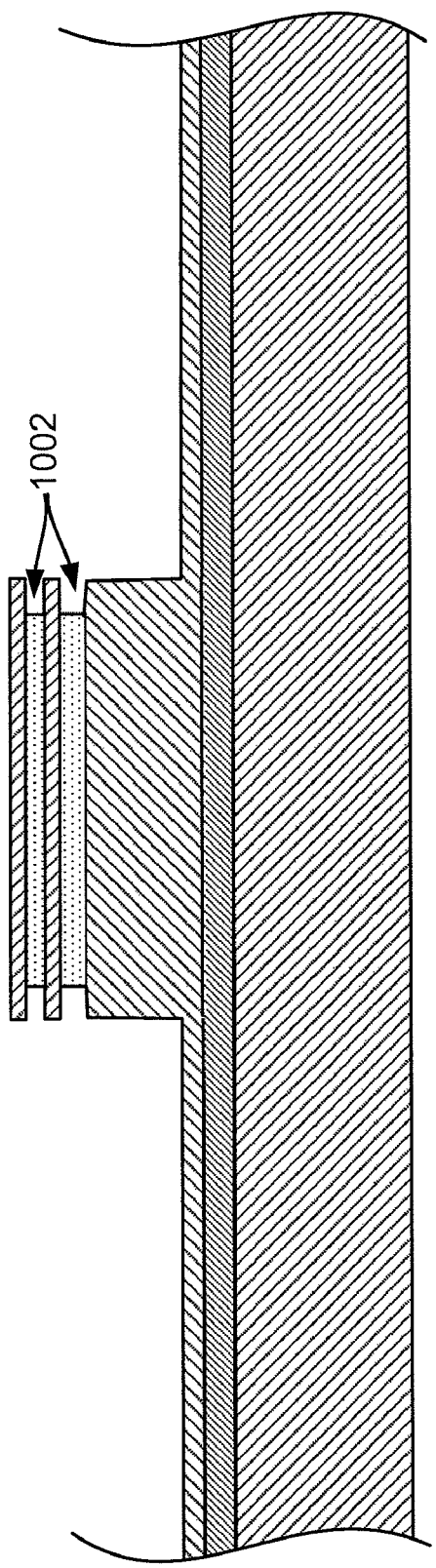

Referring to FIG. 10, the method subjects the dielectric mask structure to a second selective etch process to remove a portion of the first dielectric layer to form an undercut region 1002 between second dielectric layers. As merely an example, for silicon oxide as the first dielectric layer and silicon nitride as the second dielectric layer, the second selective etch process can use a wet etch process or an acid dip process using buffered hydrofluoric (BHF) acid. In this example, a portion of each of the silicon oxide layer is removed and the undercut region is formed between the silicon nitride layers. Other suitable etchants or process may also be used depending on the embodiment.

Alternatively, a portion of the silicon nitride may be selectively removed to form the undercut region between silicon oxide layers depending on the embodiment. The silicon nitride may be selectively removed using a phosphoric acid in a specific embodiment.

Figure 11:
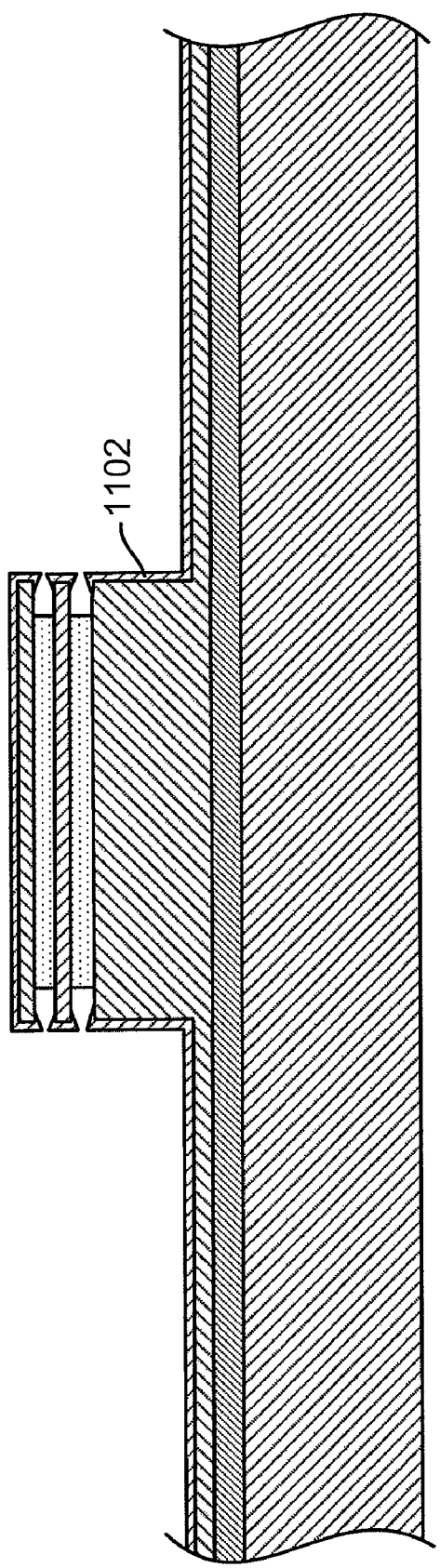

Referring to FIG. 11. In a specific embodiment, the method deposits a passivation layer 1102 overlying the dielectric mask structure, the exposed side region of the laser diode structure, and the first exposed region of the upper clad layer while the undercut region remained intact and substantially unfilled. The passivation layer can be deposited using a directional deposition process such as an electron beam deposition and using material such as zirconium oxide, tantalum oxide, amorphous silicon and the like in a preferred embodiment.

Figure 12:
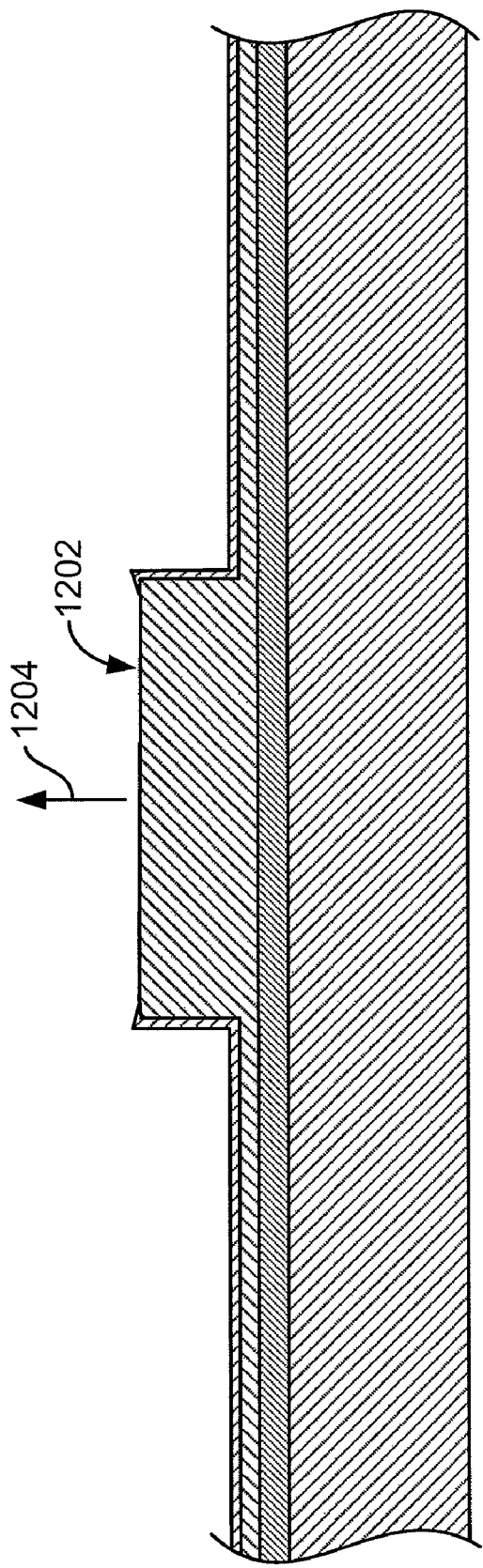

In a specific embodiment, the method includes selectively removing the dielectric mask structure to expose a top region 1202 of the laser diode structure as illustrated in FIG. 12. As shown, the passivation layer remained intact. A wet etch process selectively etches the dielectric mask is used. For example, for a silicon oxide/silicon nitride stack and a zirconium oxide passivation layer, the wet etch process can use etchant such as buffered HF and the like. Effectively, the undercut region in the dielectric stack allows for the etching process to occur in an lateral direction 1204 thereby lift off the dielectric stack with no residue remain on the top region of the laser diode structure. As shown, the passivation layer remained on the side region of the laser diode structure and the first exposed region of the upper clad layer.

Figure 13:
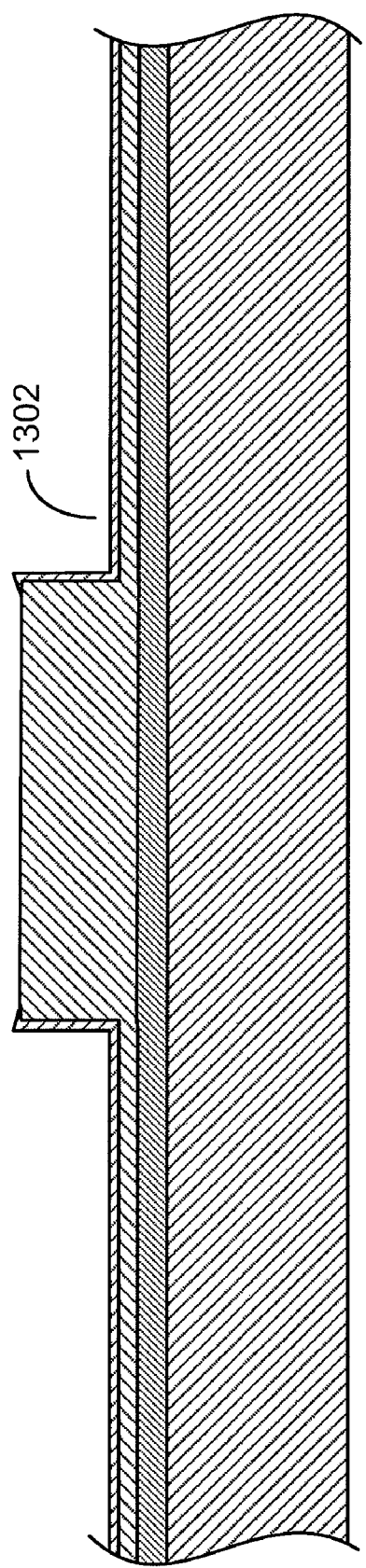

As shown in FIG. 13, a conductive layer 1302 is deposited overlying the exposed top region of the laser diode structure to form a contact element for the laser diode structure. Depending on the embodiment, the contact element can have a p-type contact, but other suitable contact elements may also be used. These other suitable contact may include a metal contact, as well as other conductive materials.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming a laser diode, comprising:
providing a laser diode material structure, including an under clad layer, an upper clad layer and an active layer sandwiched between the under clad layer and the upper clad layer, the upper clad layer having a surface region;
depositing a multilayer dielectric stack overlying the surface region, the multilayer dielectric stack comprising alternating layers of at least a first dielectric layer and a second dielectric layer;
selectively removing a portion of the multilayer dielectric stack to form a dielectric mask structure using a pattern and etching process;
removing a portion of the upper clad layer using the dielectric mask structure as a mask,
forming a laser diode structure, the laser diode structure having an exposed sidewall region and a top region while maintaining the dielectric mask structure substantially intact;
selectively removing a portion of at least the first dielectric layers to form an undercut region between second dielectric layers;
depositing at least one passivation layer overlying a first surface region of the upper clad layer, the exposed sidewall region, and the dielectric mask structure, while maintaining the undercut region;
removing the dielectric mask structure using a selective etch process, the undercut region allowing the selective etch process to occur in a lateral direction;
exposing a top surface region; and
forming a contact structure overlying at least the top surface region.

2. The method of claim 1 wherein the upper clad layer comprises a first gallium nitride material.

3. The method of claim 1 wherein the active layer comprises a doped gallium nitride material (InGaN, AlGaN).

4. The method of claim 1 wherein the under clad layer comprises a second gallium nitride material.

5. The method of claim 1 wherein the first dielectric layer overlies the surface region.

6. The method of claim 1 wherein the upper clad layer, the active layer, and the under clad layer are each formed using MOCVD or a molecular beam epitaxial method.

7. The method of claim 1 wherein the first dielectric layer includes a silicon oxide material.

8. The method of claim 1 wherein the second dielectric layer includes a silicon nitride material.

9. The method of claim 1 wherein selectively removing a portion of the first dielectric layer comprises a wet etch process.

10. The method of claim 9 wherein the wet etch process uses at least a buffered HF as an etchant.

11. The method of claim 1 wherein the pattern and etch process includes a patterning step and a dry etch step.

12. The method of claim 1 wherein the undercut region is a void region.

13. The method of claim 1 wherein the passivation layer is selected from $ZrO_2$, $Ta_2O_5$, amorphous silicon or a combination thereof and conformally covers the first surface region.

14. The method of claim 1 wherein the contact structure has a p-type characteristics.

15. The method of claim 1 wherein the contact structure comprises metal.

* * * * *

UNITED STATES PATENT AND TRADEMARK OFFICE
CERTIFICATE OF CORRECTION

| | | |
|---|---|---|
| PATENT NO. | : 8,143,148 B1 | Page 1 of 1 |
| APPLICATION NO. | : 12/502382 | |
| DATED | : March 27, 2012 | |
| INVENTOR(S) | : James W. Raring et al. | |

It is certified that error appears in the above-identified patent and that said Letters Patent is hereby corrected as shown below:

Claim 1, column 9, lines 20-21, please delete "dielectric layers" and insert -- dielectric layer --.

Signed and Sealed this
Second Day of October, 2012

David J. Kappos
*Director of the United States Patent and Trademark Office*